United States Patent [19]

Baek

[11] Patent Number: 5,537,060

[45] Date of Patent: Jul. 16, 1996

[54] OUTPUT BUFFER CIRCUIT FOR MEMORY DEVICE

[75] Inventor: Daebong Baek, Seoul, Rep. of Korea

[73] Assignee: Goldstar Electron Co., Ltd., Choongchungbook-Do, Rep. of Korea

[21] Appl. No.: 362,301

[22] Filed: Dec. 22, 1994

[30] Foreign Application Priority Data

Oct. 13, 1994 [KR] Rep. of Korea .................. 26223/1994

[51] Int. Cl.⁶ ...................................................... H03K 17/16
[52] U.S. Cl. .................................. 326/87; 326/58; 326/27
[58] Field of Search .................................. 326/87, 27, 58, 326/121

[56] References Cited

U.S. PATENT DOCUMENTS

| | | | |
|---|---|---|---|
| 4,959,561 | 9/1990 | McDermott | 326/87 |
| 5,057,711 | 10/1991 | Lee | 326/87 |
| 5,319,260 | 6/1994 | Wanless | 326/87 |
| 5,332,932 | 7/1994 | Runaldue | 326/87 |
| 5,426,376 | 6/1995 | Wong | 326/27 |

*Primary Examiner*—Edward P. Westin
*Assistant Examiner*—Andrew Sanders
*Attorney, Agent, or Firm*—Lowe, Price, LeBlanc & Becker

[57] ABSTRACT

An output buffer circuit for a memory device comprising a pull-up path including first and second PMOS transistors for forming two parallel charging paths, and a pull-down path including first and second NMOS transistors for forming two parallel discharging paths. The first and second PMOS transistors are selectively operated according to a level of an output voltage at an output terminal to perform a charging operation for a load capacitance connected to the output terminal. The first and second NMOS transistors are selectively operated according to the level of the output voltage at the output terminal to perform a discharging operation for the load capacitance through a lead inductance.

4 Claims, 4 Drawing Sheets

5,537,060

OUTPUT BUFFER CIRCUIT FOR MEMORY DEVICE

BACKGROUND OF THE INVENTION

1. Field of the Invention

The present invention relates in general to an output buffer circuit for a memory device,.and more particularly to an output buffer circuit for a memory device in which two pairs of MOS transistors are complementarily connected-to each other, two charging paths are formed in one of the two pairs of MOS transistors and two discharging paths are formed in the other pair of MOS transistors, so that a load capacitance can charge or discharge along a desired one of the two charging paths and the two discharging paths according to a level of an output voltage.

2. Description of the Prior Art

Generally, a MOS memory device comprises a plurality of memory cells, each of which consists of a MOS transistor. The MOS transistors constitute a memory cell matrix. When a predetermined address signal and a predetermined read control signal are applied to the MOS memory device, desired data is read from the corresponding memory cell and then outputted through an output buffer circuit.

Such a conventional output buffer circuit comprises a pair of PMOS and NMOS transistors connected commonly at their drains in a complementary manner. The PMOS transistor has a source connected to a supply voltage and the NMOS transistor has a source connected to a ground voltage through a lead inductance by a bonding wire or a lead wire of a lead frame. As a result, as the PMOS and NMOS transistor's are operated in response to data signals applied to gates thereof, a final data signal is outputted from an output terminal connected to an intermediate junction point of the drains of the PMOS and NMOS transistors. On the other hand, a load capacitance is connected to the output terminal of the output buffer circuit. The load capacitance has a capacity based on a standard of the MOS memory device. When the load capacitance discharges through the lead inductance according to the operations of the PMOS and NMOS transistors, an induced voltage is generated in the lead inductance. However, such an induced voltage may vary reference voltages of other circuits connected to the memory cell matrix. Furthermore, in the case where a plurality of output buffers are coupled in one memory device, the induced voltages of the corresponding number are simultaneously generated, resulting in a high voltage of several hundred millivolts. For this reason, an output signal of the output buffer circuit is distorted due to an abrupt variation of the induced voltage.

Referring to FIG. 1, there is shown a circuit diagram of a conventional output buffer circuit having an induced voltage attenuating function. As shown in this drawing, the conventional output buffer circuit comprises an inverter 12 for inverting an output disable signal OD, a NANDgate 11 for NANDing a data signal and an output signal from the inverter 12, a first NOR gate 13 for NORing the data signal and the output disable signal OD, an inverter 14 for inverting the data signal, an inverter 15 for inverting an output signal from the inverter 14, a second NOR gate 13 for NORing an output signal from the inverter 15, the data signal and the output disable signal OD, and a PMOS transistor 17 for performing a switching operation. The PMOS transistor 17 has a gate connected to an output terminal of the NAND gate 11, a source connected to a supply voltage Vdd and a drain connected to a drain of a first NMOS transistor 18.

The first NMOS transistor 18 is adapted to perform a switching operation. To this end, the first NMOS transistor 18 has a gate connected to an output terminal of the first NOR gate 13, a source connected to a ground terminal through a lead inductance 19 and the drain connected to the drain of the PMOS transistor 17.

Further, the conventional output buffer circuit comprises a second NMOS transistor 20 for performing a switching operation. The second NMOS transistor 20 has a gate connected to an output terminal of the second NOR gate 16, a drain connected to the drain of the first NMOS transistor 18 and a source connected to the source of the first NMOS transistor 18.

The operation of the conventional output buffer circuit for the memory device with the above-mentioned construction will hereinafter be described.

First, when the output disable signal OD is high in logic, it is inverted into low logic and then applied to the NAND gate 11. As a result, the NAND gate 11 outputs a high logic signal regardless of the other input signal, thereby causing the PMOS transistor 17 to be turned off. Also, the first NOR gate 13 outputs a low logic signal regardless of the other input signal, thereby causing the first NMOS transistor 18 to be turned off. Similarly, the second NOR gate 16 outputs a low logic signal regardless of other input signals, thereby causing the second NMOS transistor 20 to be turned off. In result, in the case where the output disable signal OD is high in logic, the circuit is turned off and the output thereof is thus disabled.

When the output disable signal OD goes low in logic and the data signal goes high in logic, the output signal of the NAND gate 11 goes low in logic, thereby causing the PMOS transistor 17 to be turned on. On the contrary, the output signals of the first and second NOR gates 13 and 16 become low in logic, so that the first and second NMOS transistors 18 and 20 are turned off. As a result, the supply voltage Vdd is charged on a load capacitance C through the turned-on PMOS transistor 17. In result, an output voltage Vout at an output terminal becomes the same as the supply voltage Vdd.

In the case where the data signal is changed from its high logic to its low logic under the above condition, the output signal of the NAND gate 11 becomes high in logic, thereby causing the PMOS transistor 17 to be turned off. Because the output signal of the first NOR gate 13 goes high in logic, the first NMOS transistor 18 is turned on. The output signal of the second NOR gate 16 goes high in logic after a delay of a predetermined time period τ from the moment that the output signal of the first NOR gate 13 goes high in logic, since the data signal is sequentially inverted by the inverters 14 and 15. The predetermined time period τ corresponds to the sum of propagation delay times of the inverters 14 and 15. In result, the second NMOS transistor 20 is turned on after the lapse of the predetermined time period τ from the moment that the first NMOS transistor 18 is turned on.

Subsequently, a charge on the load capacitance C is first discharged through the first NMOS transistor 18. Then, the charge on the load capacitance C begins to be discharged through the second NMOS transistor 20 when the predetermined time period τ has elapsed. In this case, currents flowing through the first and second NMOS transistors 18 and 20 have waveforms as shown in FIGS. 2A and 2B, respectively. The current i18 flowing through the first NMOS transistor 18 has a peak value I1 for ON-time ΔT1 as shown in FIG. 2A. As shown in FIG. 2B, the current i20 flowing through the second NMOS transistor 20 has a peak value I2 for ON-time ΔT2 shorter by the predetermined time period r than that of the first NMOS transistor 18.

The total current iS flowing through the lead inductance 19 of the output buffer circuit is the sum of the current i18 flowing through the first NMOS transistor 18 and the current i20 flowing through the second NMOS transistor 20. As shown in FIG. 2C, the total current iS has the same peak value I1 as that of the first NMOS transistor 18 for ON-time ΔT3.

In the conventional output buffer circuit, as mentioned above, the delay time t is adjustable by sizes of the first and second NMOS transistors 18 and 20 to lower a peak value of current resulting from an induced voltage generated in the lead inductance 19. Therefore, the conventional output buffer circuit can prevent a distortion of the output signal due to an abrupt variation of a peak voltage. However, in the conventional output buffer circuit, the first and second NMOS transistors 18 and 20 are nearly simultaneously turned on because the delay time must typically be 3–4 ns to maintain the operation at a high speed. For this reason, the current peak value cannot in practice be lowered as shown in FIG. 4.

SUMMARY OF THE INVENTION

Therefore, the present invention has been made in view of the above problem, and it is an object of the present invention to provide an output buffer circuit for a memory device in which two pairs of MOS transistors are complementarily connected to each other, two charging paths are formed in one of the two pairs of MOS transistors and two discharging paths are formed in the other pair of MOS transistors, so that a load capacitance can charge or discharge along a desired one of the two charging paths and the two discharging paths according to a level of an output voltage, so as to avoid an abrupt variation of an induced voltage generated in a lead inductance to prevent a distortion of an output data signal.

In accordance with the present invention, the above and other objects can be accomplished by a provision of an output buffer circuit for a memory device comprising a pull-up path including first and second switching means for forming two parallel charging paths, said first and second switching means being selectively operated according to a level of an output voltage at an output terminal to perform a charging operation for a load capacitance connected to said output terminal; and a pull-down path including third and fourth switching means for forming two parallel discharging paths, said third and fourth switching means being selectively operated according to the level of the output voltage at said output terminal to perform a discharging operation for said load capacitance through a lead inductance.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 3:
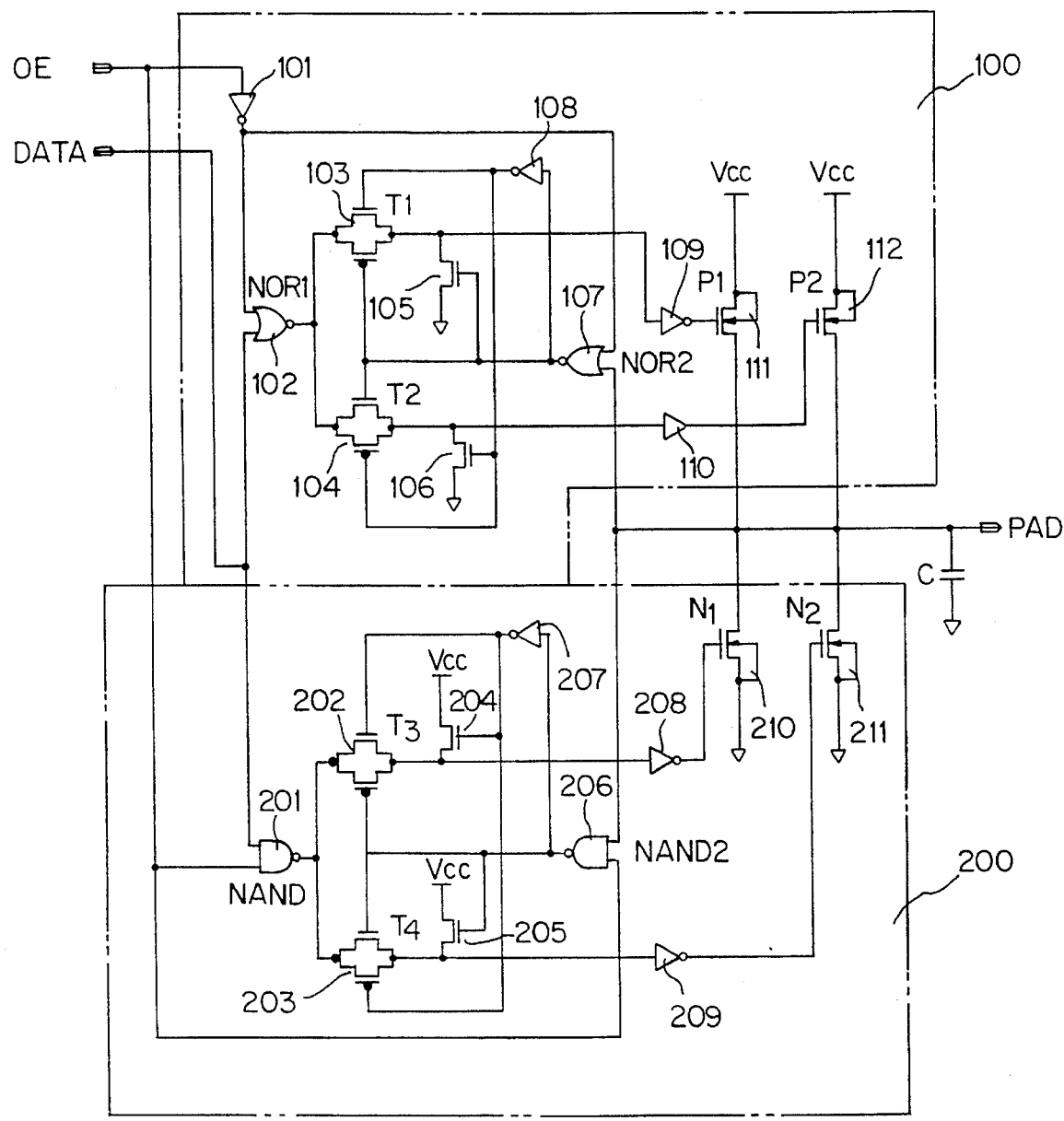
FIG. 3 is a circuit diagram of an output buffer circuit for a memory device in accordance with the present invention.

Referring to FIG. 3, there is shown a circuit diagram of an output buffer circuit for a memory device in accordance with the present invention. As shown in this drawing, the output buffer circuit comprises a pull-up path 100 responsive to a data signal and an output enable signal OE, for allowing a load capacitance C connected to an output terminal or a pad to charge, and a pull-down path 200 responsive to the data signal and the output enable signal OE, for allowing the load capacitance C connected to the pad to discharge.

The pull-up path 100 comprises an inverter 101 for inverting the output enable signal OE, a first NOR gate 102 for NORing the data signal and an output signal from the inverter 101, a second NOR gate 107 for NORing the output signal from the inverter 101 and an output signal at the pad, an inverter 108 for inverting an output signal from the second NOR gate 107, and a first transmission gate 103 for performing a switching operation. The first transmission gate 103 includes a pair of NMOS and PMOS transistors connected commonly at their sources and drains. The sources of the NMOS and PMOS transistors of the first transmission gate 103 are connected to an output terminal of the first NOR gate 102. The drains of the NMOS and PMOS transistors of the first transmission gate 103 are connected to an input terminal of an inverter 109. The NMOS transistor of the first transmission gate 103 has a gate connected to an output terminal of the inverter 108 and the PMOS transistor of the first transmission gate 103 has a gate connected to an output terminal of the second NOR gate 107.

The pull-up path 100 also comprises a second transmission gate 104 for performing a switching operation. The second transmission gate 104 includes a pair of NMOS-and PMOS transistors connected commonly at their sources and drains. The sources of the NMOS and PMOS transistors of the second transmission gate 104 are connected to the output terminal of the first NOR gate 102. The drains of the NMOS and PMOS transistors of the second transmission gate 104 are connected to an input terminal of an inverter 110. The NMOS transistor of the second transmission gate 104 has a gate connected to the output terminal of the second NOR gate 107 and the PMOS transistor of the second transmission gate 104 has a gate connected to the output terminal of the inverter 108.

Further, the pull-up path 100 comprises an NMOS transistor 105 for performing a floating prevention operation. The NMOS transistor 105 has a gate connected to the output terminal of the second NOR gate 107, a drain connected to an output terminal of the first transmission gate 103 and a source connected to a ground terminal.

Further, the pull-up path 100 comprises an NMOS transistor 106 for performing a floating prevention operation. The NMOS transistor 106 has a gate connected to the output terminal of the inverter 108, a drain connected to an output terminal of the second transmission gate 104 and a source connected to the ground terminal.

The inverter 109 is adapted to invert an output signal from the first transmission gate 103 and the inverter 110 is adapted to invert an output signal from the second transmission gate 104.

Further, the pull-up path 100 comprises a first PMOS transistor 111 for performing a switching operation. The first PMOS transistor 111 has a gate connected to an output terminal of the inverter 109, a source connected to a supply voltage Vcc and a drain connected to a drain of a first NMOS transistor 210 of the pull-down path 200.

Further, the pull-up path 100 comprises a second PMOS transistor 112 for performing a switching operation. The second PMOS transistor 112 has a gate connected to an output terminal of the inverter 110, a source connected to the supply voltage Vcc and a drain connected to a drain of a second NMOS transistor 211 of the pull-down path 200.

The pull-down path 200 comprises a first NAND gate 201 for NANDing the data signal and the output enable signal OE, a second NAND gate 206 for NANDing the output enable signal 0E and the output signal at the pad, an inverter 207 for inverting an output signal from the second NAND gate 206, and a third transmission gate 202 for performing a switching operation. The third transmission gate 202 includes a pair of NMOS and PMOS transistors connected commonly at their sources and drains. The sources of the NMOS and PMOS transistors of the third transmission gate 202 are connected to an output terminal of the first NAND gate 201. The drains of the NMOS and PMOS transistors of the third transmission gate 202 are connected to an input terminal of an inverter 208. The NMOS transistor of the third transmission gate 202 has a gate connected to an output terminal of the inverter 207 and the PMOS transistor of the third transmission gate 202 has a gate connected to an output terminal of the second NAND gate 206.

The pull-down path 200 also comprises a fourth transmission gate 203 for performing a switching operation. The fourth transmission gate 203 includes a pair of NMOS and PMOS transistors connected commonly at their sources and drains. The sources of the NMOS and PMOS transistors of the fourth transmission gate 203 are connected to the output terminal of the first NAND gate 201. The drains of the NMOS and PMOS transistors of the fourth transmission gate 203 are connected to all input terminal of an inverter 209. The NMOS transistor of the fourth transmission gate 203 has a gate connected to the output terminal of the second NAND gate 206 and the PMOS transistor of the fourth transmission gate 203 has a gate connected to the output terminal of the inverter 207.

Further, the pull-down path 200 comprises a PMOS transistor 204 for performing a floating prevention operation. The PMOS transistor 204 has a gate connected to the output terminal of the inverter 207, a drain connected to an output terminal of the third transmission gate 202 and a source connected to the supply voltage Vcc.

Further, the pull-down path 200 comprises a PMOS transistor 205 for performing a floating prevention operation. The PMOS transistor 205 has a gate connected to the output terminal of the second NAND gate 206, a drain connected to an output terminal of the fourth transmission gate 203 and a source connected to the supply voltage.

The inverter 208 is adapted to invert an output signal from the third transmission gate 202 and the inverter 209 is adapted to invert an output signal from the fourth transmission gate 203.

Further, the pull-down path 200 comprises the first NMOS transistor 210 for performing a switching operation. The first NMOS transistor 210 has a gate connected to an output terminal of the inverter 208, a source connected to the ground terminal and the drain connected to the drain of the first PMOS transistor 111 of the pull-up path 100.

Further, the pull-down path 200 comprises the second NMOS transistor 211 for performing a switching operation.

The second NMOS transistor 211 has a gate connected to an output terminal of the inverter 209, a source connected to the ground terminal and the drain connected to the drain of the second PMOS transistor 112 of the pull-up path 100.

Each of the NMOS transistors 105 and 106 and the PMOS transistors 204 and 205 acts to prevent the output signal of a corresponding one of the first to fourth transmission gates 103, 104, 202 and 203 from being floated when the corresponding transmission gate is at a.standby state because of no selection. The output terminal or the pad is connected to input terminals of the second NOR gate 107 and the second NAND gate 206, an intermediate junction point of the drains of the first PMOS transistor 111 and the first NMOS transistor 210 and an intermediate junction point of the drains of the second PMOS transistor 112 and the second NMOS transistor 211.

The operation of the output buffer circuit for the memory device with the above-mentioned construction in accordance with the present invention will hereinafter be described in detail.

First, when the output enable signal OE is low in logic, in the pull-up path 100, it is inverted into high logic by the inverter 101 and then applied to the first and second NOR gates 102 and 107. As a result, each of the first and second NOR gates 102 and 107 outputs a low logic signal regardless of the other input signal. The low logic signal from the second NOR gate 107 is applied to the gate of the PMOS transistor of the first transmission gate 103. Also, the low logic signal from the second NOR gate 107 is inverted into high logic by the inverter 108 and then applied to the gate of the NMOS transistor of the first transmission gate 103. As a result, the first transmission gate 103 acts as a turned-on switch. Namely, the first transmission gate 103 transfers the low logic signal from the first NOR gate 102 to the inverter 109. Then, the low logic signal from the first NOR gate 102 is inverted into high logic by the inverter 109 and then applied to the gate of the first PMOS transistor 111, thereby causing the first PMOS transistor 111 to be turned off. On the other hand, the low logic signal from the second NOR gate 107 is applied to the gate of the NMOS transistor of the second transmission gate 104. Also, the low logic signal from the second NOR gate 107 is inverted into high logic by the inverter 108 and then applied to the gate of the PMOS transistor of the second transmission gate 104. As a result, the second transmission gate 104 is turned off.

In the case where the output enable signal OE is low in logic, in the pull-down path 200, each of the first and second NAND gates 201 and 206 outputs a high logic signal regardless of the other input signal. The high logic signal from the second NAND gate 206 is applied to the gate of the PMOS transistor of the third transmission gate 202. Also, the high logic signal from the second NAND gate 206 is inverted into low logic by the inverter 207 and then applied to the gate of the NMOS transistor of the third transmission gate 202. As a result, the third transmission gate 202 is turned off. On the other hand, the high logic signal from the second NAND gate 206 is applied to the gate of the NMOS transistor of the fourth transmission gate 203. Also, the high logic signal from the second NAND gate 206 is inverted into low logic by the inverter 207 and then applied to the gate of the PMOS transistor of the fourth transmission gate 203. As a result, the fourth transmission gate 203 is acts as a turned-on switch. Namely, the fourth transmission gate 203 transfers the high logic signal from the first NAND gate 201 to the inverter 209. Then, the high logic signal from the first NAND gate 201 is inverted into low logic by the inverter 209 and then applied to the gate of the second NMOS transistor 211, thereby causing the second NMOS transistor 211 to be turned off.

As mentioned above, the output buffer circuit of the present invention is not operated when the output enable signal OE is low in logic.

In the case where the output enable signal OE is high in logic and the data signal is low in logic, in the pull-up path 100, the output signal of the first NOR gate 102 goes high in logic. The output signal of the second NOR gate 107 goes high in logic if the previous state of the output signal at the pad is low in logic. The high logic signal from the second NOR gate 107 is applied to the gates of the PMOS and NMOS transistors of the first and second transmission gates 103 and 104. Also, the high logic signal from the second NOR gate 107 is inverted into low logic by the inverter 108 and then applied to the gates of the NMOS and PMOS transistors of the first and second transmission gates 103 and 104. As a result, the second transmission gate 104 is turned on, whereas the first transmission gate 103 is turned off. As being turned on, the second transmission gate 104 transfers the high logic signal from the first NOR gate 102 to the inverter 110. Then, the high logic signal from the first NOR gate 102 is inverted into low logic by the inverter 110 and then applied to the gate of the second PMOS transistor 112, thereby causing the second PMOS transistor 112 to be turned on. With the second PMOS transistor 112 turned on, the load capacitance C connected to the pad begins to charge. As the load capacitance C charges, a level of an output voltage Vout reaches that of a threshold voltage Vth of the second NOR gate 107. At this time, the output signal of the second NOR gate 107 goes low in logic, thereby causing the second transmission gate 104 to be turned off, whereas the first transmission gate 103 to be turned on. As being turned on, the third transmission gate 103 transfers the high logic signal from the first NOR gate 102 to the inverter 109. Then, the high logic signal from the first NOR gate 102 is inverted into low logic by the inverter 109 and then applied to the gate of the first PMOS transistor 111, thereby causing the first PMOS transistor 111 to be turned on. With the first PMOS transistor 111 turned on, the load capacitance C connected to the pad continues to charge. In this manner, the load capacitance C charges along any one of the different paths such as the first PMOS transistor 111 and the second PMOS transistor 112 according to the threshold voltage Vth of the second NOR gate 107.

Then, when the output enable signal OE is high in logic and the data signal is high in logic, in the pull-down path 200, the output signal of the first NAND gate 201 goes low in logic. The output signal of the second NAND gate 206 goes low in logic if the previous state of the output signal at the pad is high in logic. The low logic signal from the second NAND gate 206 is applied to the gates of the PMOS and NMOS transistors of the third and fourth transmission gates 202 and 203. Also, the low logic signal from the second NAND gate 206 is inverted into high logic by the inverter 207 and then applied to the gates of the NMOS and PMOS transistors of the third and fourth transmission gates 202 and 203. As a result, the third transmission gate 202 is turned on, whereas the fourth transmission gate 203 is turned off. As being turned on, the third transmission gate 202 transfers the low logic signal from the first NAND gate 201 to the inverter 208. Then, the low logic signal from the first NAND gate 201 is inverted into high logic by the inverter 208 and then applied to the gate of the first NMOS transistor 210, thereby causing the first NMOS transistor 210 to be turned on. With the first NMOS transistor 210 turned on, the load capacitance C connected to the pad begins to discharge. As the load capacitance C discharges, the level of the output voltage Vout reaches that of a threshold voltage Vth of the second NAND gate 206. At this time, the output signal of the second NAND gate 206 goes high in logic, thereby causing the third transmission gate 202 to be turned off, whereas the fourth transmission gate 203 to be turned on. As being turned on, the fourth transmission gate 203 transfers the low logic signal from the first NAND gate 201 to the inverter 209. Then, the low logic signal from the first NAND gate 201 is inverted into high logic by the inverter 209 and then applied to the gate of the second NMOS transistor 211, thereby causing the second NMOS transistor 211 to be turned on. With the second NMOS transistor 211 turned on, the load capacitance C connected to the pad continues to discharge. In this manner, the load capacitance C discharges along any one of the different paths such as the first NMOS transistor 210 and the second NMOS transistor 211 according to the threshold voltage Vth of the second NAND gate 206.

Figure 1:
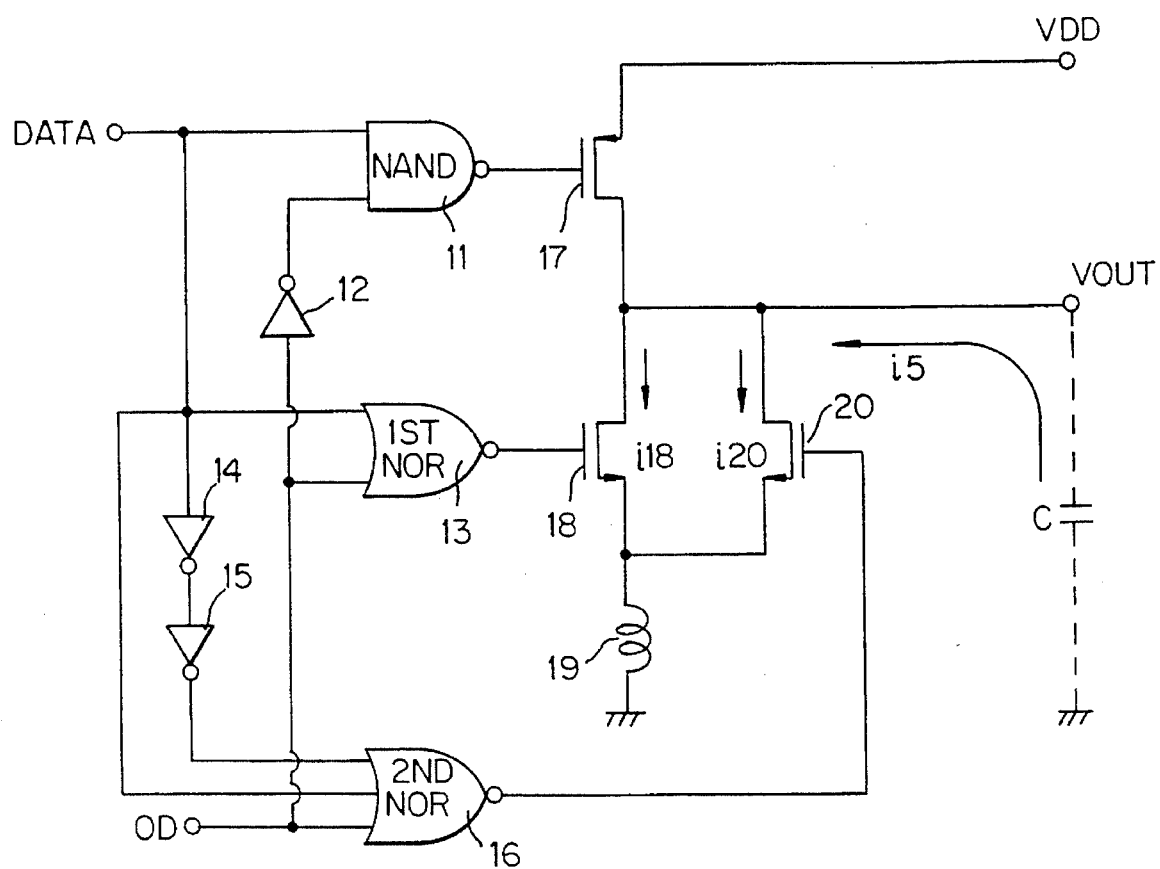
FIG. 1 is a circuit diagram of a conventional output buffer circuit for a memory device.
Figure 2A:
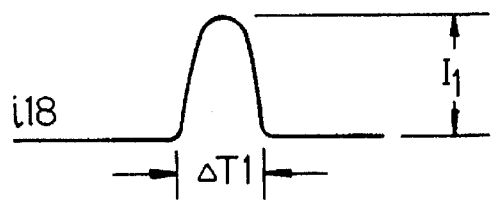
FIGS. 2A to 2C are waveform diagrams of currents from components in FIG. 1.
Figure 2B:
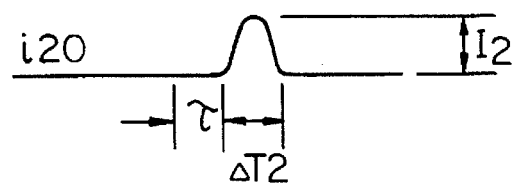
Figure 2C:
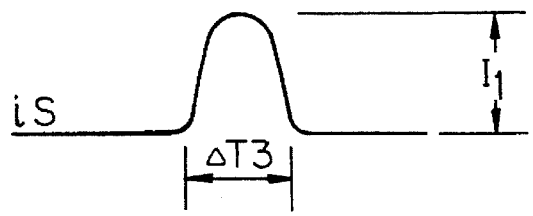
Figure 4:
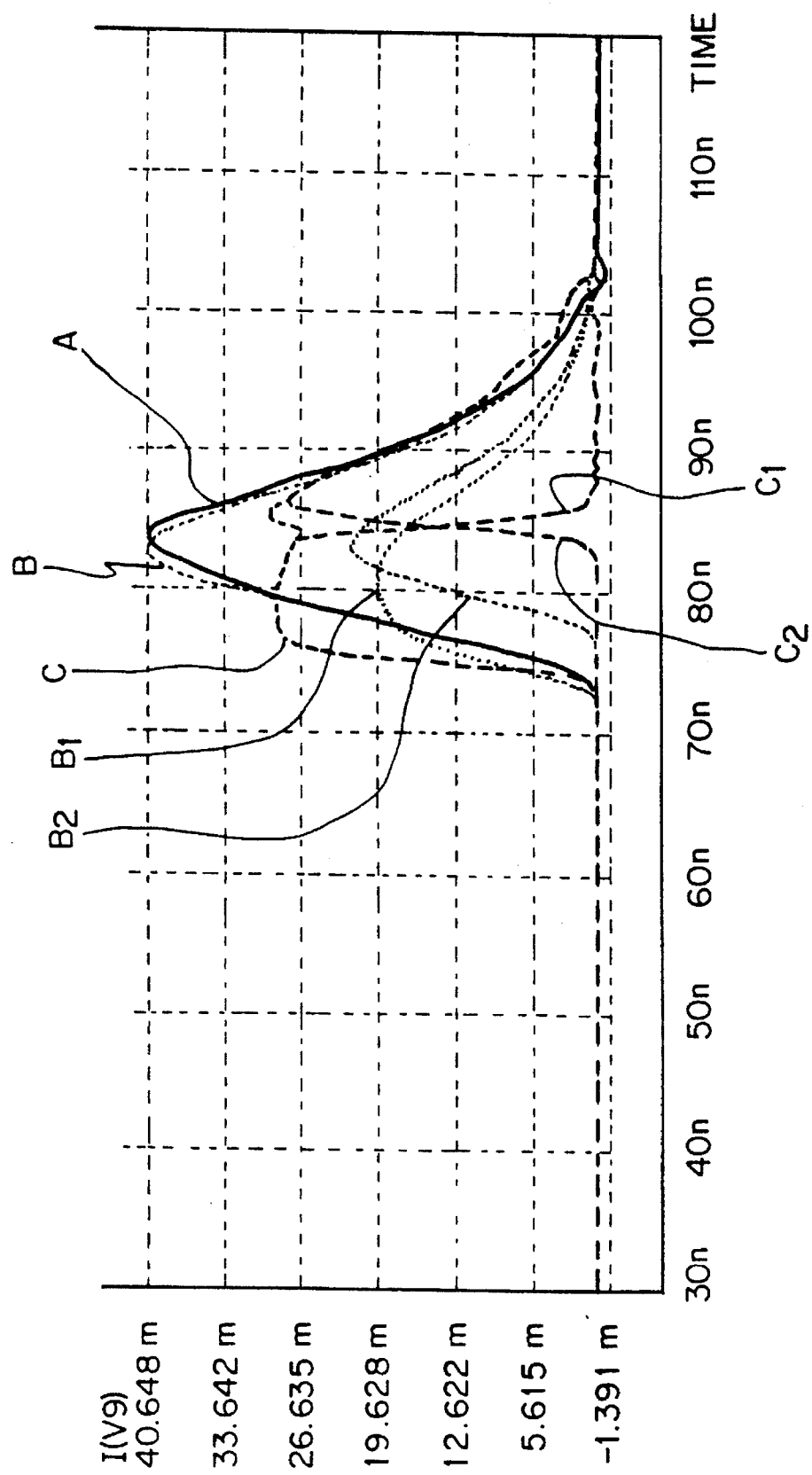
FIG. 4 is a view illustrating comparison of current waveforms in FIGS. 1 and 3.

FIG. 4 is a view illustrating comparison of current waveforms in FIGS. 1 and 3. In this drawing, a graph A is a waveform of a discharging current in a general output buffer circuit and a graph B is a waveform of a discharging current in the conventional output buffer circuit for lowering the peak current value as shown in FIG. 1. A current value of the graph B is the sum of currents B1 and B2 flowing along the different paths depending on the delay time t. In this case, however, the two NMOS transistors are nearly simultaneously turned on because the delay time must typically be 3–4 ns to maintain the operation at the high speed. As a result, it can be seen that there is little difference between the current waveforms of the graphs A and B. A graph C is a waveform of a discharging current in the output buffer circuit of the present invention. A current value of the graph C is the sum of currents C1 and C2 flowing along the different paths depending on the level of the output voltage. From the graph C, it can be seen that the output buffer circuit of the present invention has a very excellent peak current attenuating effect as compared with the conventional output buffer circuit.

As apparent from the above description, according to the present invention, the load capacitance can charge or discharge along the desired one of the two charging paths and the two discharging paths according to the level of the output voltage, resulting in a reduction in an instantaneous peak current value. Therefore, the output buffer circuit of the present invention has the effect of removing a distortion of the output signal thereof. Also, a current ratio between the charging paths and a current ratio between the discharging paths can be adjusted respectively by adjusting the threshold voltages Vth of the second NOR gate 107 and the second NAND gate 206.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An output buffer circuit, comprising:

an output terminal; and a pull-up path between a power supply voltage source and the output terminal, wherein said pull-up path includes:

a first inverter for inverting an output enable signal, a first NOR gate for NORing a data signal and an output signal from said first inverter, a second NOR gate for NORing an output signal from said first inverter and an output voltage of said output terminal, first and second transmission gates being seiectively operated in response to an output signal from said second NOR gate to transfer an output signal from said first NOR gate to a first and a second switching means, respectively, means for preventing floating of said first and second transmission gates in a standby mode, a second inverter for inverting an output signal from said first transmission gate, a third inverter for inverting an output signal from said second transmission gate, and first and second switching means each connected between the power supply voltage source and the output terminal, being switched in response to output signals from said second and third inverters, respectively, to source current such that the first and second switching means form two respective parallel current sourcing paths.

2. An output buffer circuit in accordance with claim 1, further comprising a pull-down path between the output terminal and ground, wherein said pull-down path includes:

a first NAND gate for NANDing a data signal and an output signal from said first inverter, a second NAND gate for NANDing an output signal from said first inverter and an output voltage of said output terminal, third and fourth transmission gates being selectively operated in response to an output signal from said second NAND gate to transfer an output signal from said first NAND gate to a third and a fourth switching means, respectively, means for preventing floating of said first and second transmission gates in a standby mode, a fourth inverter for inverting an output signal from said third transmission gate, a fifth inverter for inverting an output signal from said fourth transmission gate, and third and fourth switching means each connected between the output terminal and ground, being switched in response to output signals from said fourth and fifth inverters, respectively, to sink current such that the third and fourth switching means form two respective parallel current sinking paths, said first and third switching means being complementarily connected and said second and fourth switching means being complementarily connected.

3. An output buffer circuit in accordance with claim 1, wherein said second NOR gate has a threshold voltage which can be adjusted to control a switching time of said parallel current sourcing paths.

4. An output buffer circuit in accordance with claim 2, wherein said second NAND gate has a threshold voltage which can be adjusted to control a switching time of said parallel current sinking paths.

* * * * *